US008878568B1

(12) United States Patent
Farzan et al.

(10) Patent No.: US 8,878,568 B1
(45) Date of Patent: Nov. 4, 2014

(54) HIGH-SPEED SSR TRANSMIT DRIVER

(71) Applicant: Semtech Canada, Inc., Burlington (CA)

(72) Inventors: Kamran Farzan, Toronto (CA); Mehrdad Ramezani, Toronto (CA); David Cassan, Toronto (CA); Angus McLaren, Toronto (CA); Saman Sadr, Toronto (CA)

(73) Assignee: Semtech Corporation (CA)

( * ) Notice: Subject to any disclaimer, the term of this patent is extended or adjusted under 35 U.S.C. 154(b) by 44 days.

(21) Appl. No.: 13/658,980

(22) Filed: Oct. 24, 2012

Related U.S. Application Data

(63) Continuation of application No. 13/611,421, filed on Sep. 12, 2012, now abandoned.

(60) Provisional application No. 61/533,571, filed on Sep. 12, 2011.

(51) Int. Cl.
*H03K 19/0175* (2006.01)

(52) U.S. Cl.
USPC .................. 326/82; 326/26; 326/30; 326/33

(58) Field of Classification Search
None
See application file for complete search history.

(56) References Cited

U.S. PATENT DOCUMENTS

| 5,440,258 | A | * | 8/1995 | Galbi et al. | 327/112 |
|---|---|---|---|---|---|
| 7,307,447 | B2 | * | 12/2007 | Clements et al. | 326/30 |
| 7,425,849 | B2 | * | 9/2008 | Gupta et al. | 327/112 |
| 8,618,833 | B1 | * | 12/2013 | Bergkvist et al. | 326/30 |

OTHER PUBLICATIONS

M. Ramezani, et al. "An 8.4mw/Gb/s 4-lane 48Gb/s Multi-Standard-compliant Transceiver in 40nm digital CMOS Technology", ISSCC Dig. Tech. Papers, Feb. 2011.
N. K. Ramamoorthy, R.M. Jayabharath, V. Muniyappa, "High Speed Serial Link Transmitter for 10Gig Ethernet Applications", VLSI Design, 2010. VLSID '10. 23rd International Conference on VLSI Design.
M. Kassel, et al. "A T-Coil-Enhanced 8.5Gb/s High-Swing SST Transmitter in 65 nm Bulk CMOS With <-16dB Return Loss Over 10GHz Bandwidth", IEEE Journal of Solid-State Circuits, vol. 43, No. 12, Dec. 2008.
C. Menolfi, et al. "A 14Gb/s high-swing Thin-Oxide Device SST TX in 45nm CMOS SOI", ISSCC Dig. Tech. Papers, Feb. 2011.
S. Quan, et al. "A 1.0625-to-14.025Gb/s Multimedia Transceiver with Full-rate Source-Series-Terminated Transmit Driver and Floating-Tap Decision Feedback Equalizer in 40nm CMOS", ISSCC Dig. Tech. Papers, Feb. 2011.
10G BASE KR specification, IEEE 802.3ap v3.3 10GBASE-KR Backplane.
"PCI Express Base specification", PCI_SIG, http://www.pcisig.com/specifications/pciexpress/base3/.

* cited by examiner

*Primary Examiner* — Anh Tran
(74) *Attorney, Agent, or Firm* — Renner Kenner; Arthur M. Reginelli

(57) ABSTRACT

A high speed transmit driver is provided, along with methods to improve driver slew rate, decrease transmit jitter, improve termination accuracy, and decrease sensitivity to supply noise.

5 Claims, 10 Drawing Sheets

HIGH-SPEED SSR TRANSMIT DRIVER

RELATED APPLICATIONS

This application claims is a continuation application of U.S. Non-Provisional application Ser. No. 13/611,421, filed on Sep. 12, 2012, which claims priority from U.S. Provisional Application 61/533,571 filed Sep. 12, 2011, which are incorporated herein by reference.

TECHNICAL FIELD

This disclosure relates generally to microelectronics circuits and particularly to the field of source-series-terminated transmit drivers.

BACKGROUND

The increasing demand for data bandwidth has driven high-speed serial link standards to impose tough constraints on link performance. Furthermore, optical and Ethernet standards are putting stringent requirements on transmit driver return loss.

BRIEF DESCRIPTION OF THE DRAWINGS

Example embodiments will be described with reference to the following Figures:

FIG. 10A is a simplified block diagram of a transmitter according to example embodiments.

DESCRIPTION OF EXAMPLE EMBODIMENTS

The increasing demand for data bandwidth has driven high-speed serial link standards to impose tough constraints on link performance. To achieve low BERs (Bit Error Rates) (e.g., on the order of $10^{-15}$), tough jitter requirements are being imposed on Transmit (Tx) drivers used for serial link applications. Furthermore, optical and Ethernet standards are putting stringent requirements on the Tx driver return loss. Such requirements necessitate architectural changes to the Tx drivers. This application introduces a novel architecture and implementation of a Tx driver with very low supply sensitivity and low output jitter. New techniques are introduced to minimize the self generated supply noise of the driver. Furthermore, a technique is presented to potentially increase the maximum driver slew rate, which may be important for driver operation at data rates higher than 14 Gb/s. In addition, a new termination calibration method is introduced that may be less sensitive to mismatch.

Demand for increased data bandwidth has made transmit driver design challenging as new transmit drivers should not only operate at higher data rates but also meet stringent requirements for return loss and jitter. In general, there are three main architectures for high-speed transmit drivers: current-mode-logic (CML), H-bridge, and source-series-terminated (SST). CML drivers generally have high power consumption and moderate return loss, whereas H-bridge drivers generally have moderate power consumption and poor return loss (See references [1]-[2]). In addition, the return loss of the CML and H-bridge drivers changes with their signal swing. However, SST drivers generally have the best power consumption and significantly smaller capacitive load and parasitics on the output nodes. Electrostatic discharge (ESD) performance of SST drivers is also generally better as there is no transistor connected directly to the pad. This allows the use of smaller ESD diodes, which results in faster driver slew rates and better return loss performance in some cases. In addition, SST drivers may in some cases be more easily ported to a different technology node. It should be mentioned, however, that SST drivers may in some cases be more sensitive to supply noise because there is a direct path between the supply and driver output. Recently, there has been an increase in the use of SST drivers due to their portable architecture and superior power, speed, and return-loss performance (See references [3]-[5]).

Figure 1:
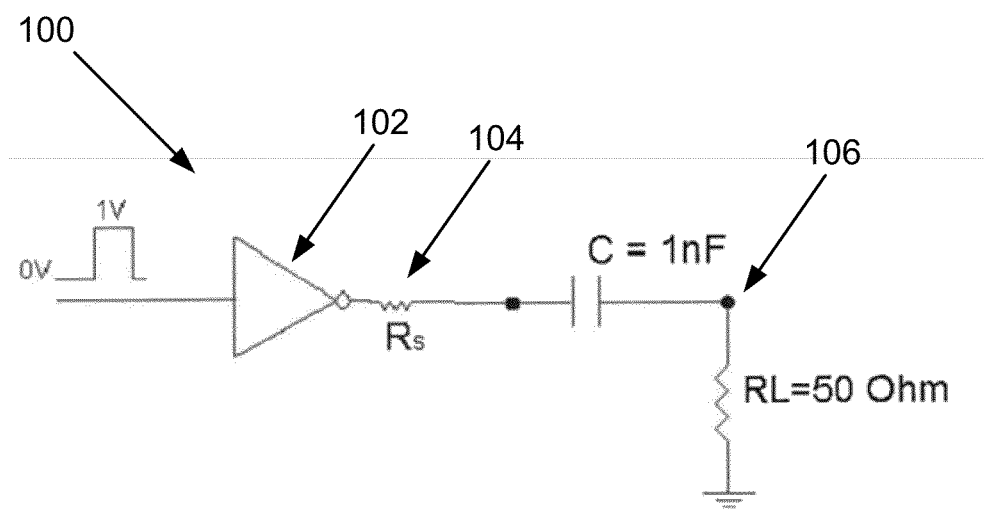
FIG. 1 is a schematic of a simplified single-ended SST driver according to example embodiments.
Figure 2A:
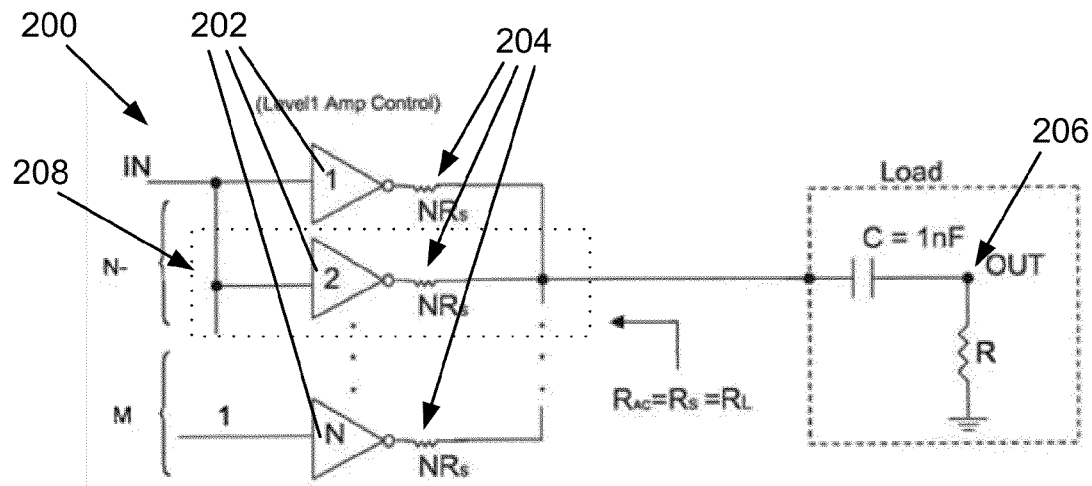
FIG. 2A is a schematic of an example implementation of amplitude control in SST drivers according to example embodiments.
Figure 2B:
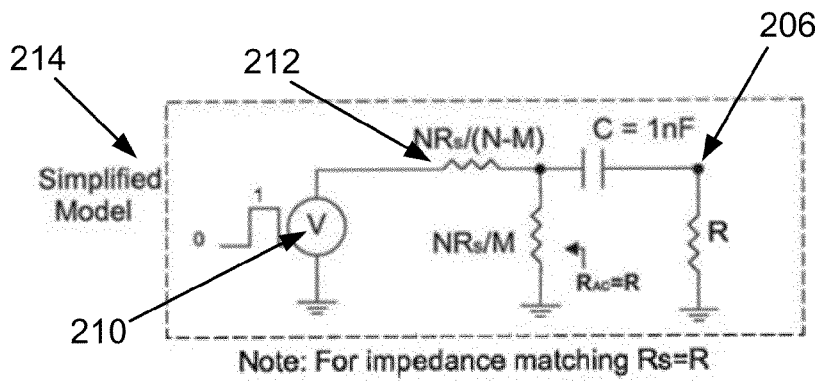
FIG. 2B is a simplified model of the example implementation of FIG. 2A.
Figures 3A, 3B:
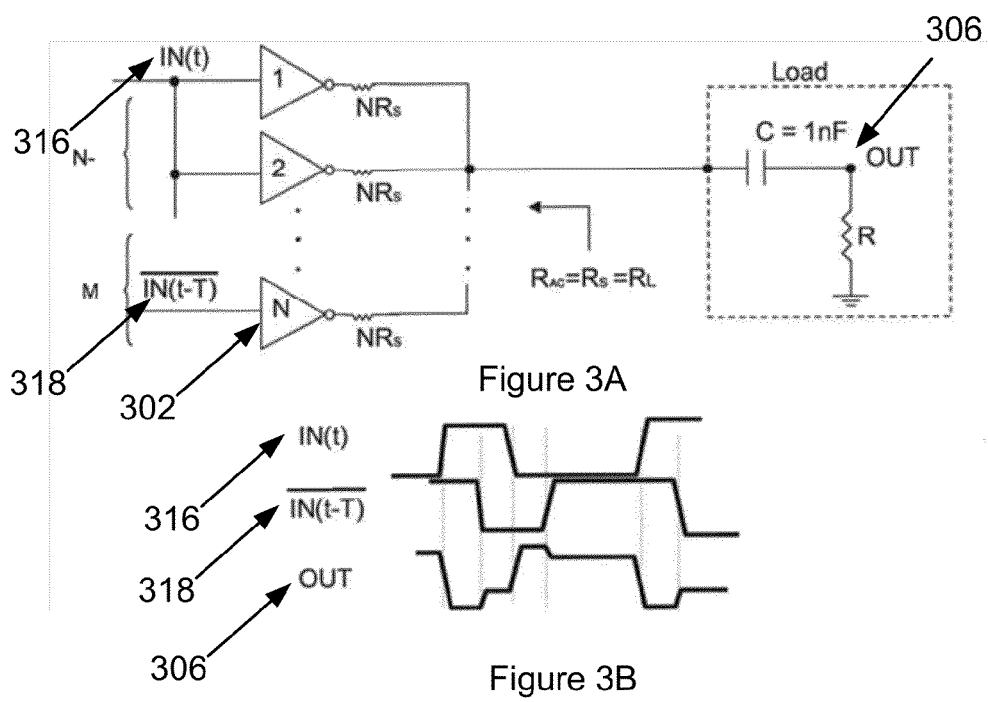
FIG. 3A is a schematic of an example implementation of TX equalization in SST drivers according to example embodiments.
FIG. 3B is a graph of the input data, delay input data, and output of the example imlpementation of FIG. 3A.

As shown in FIG. 1, an SST driver 100 can be as simple as an inverter 102 with series resistance 104 at the output 106. However, as shown in FIG. 2A, a practical TX driver 200 consists of a number of inverters 202 with series resistances 204 in parallel to implement the amplitude control and transmit equalization. Here a single parallel branch will be referred to as a slice 208 of the transmit driver. To reduce the driver amplitude, the input of some of the slices 208 would be connected to supply to form a voltage division and therefore exhibit smaller amplitude. A simplified model 214 of such a driver 200 is shown in FIG. 2B, showing the source 210 and output 206, and showing the slices 208 represented by a single resistance 212. Also, as shown in FIG. 3A, the input of some of the inverters 302 can be connected to a delayed version 318 of the input data 316 to provide transmit equalization. A graph of the input data 316, delayed version 318 of the input data, and the output 306 are shown in FIG. 3B. Despite the simplicity of the basic structure of the SST driver, there are numerous trade-offs and challenges for high-speed implementation, which will be discussed in more detail below.

Figures 4A, 4B:
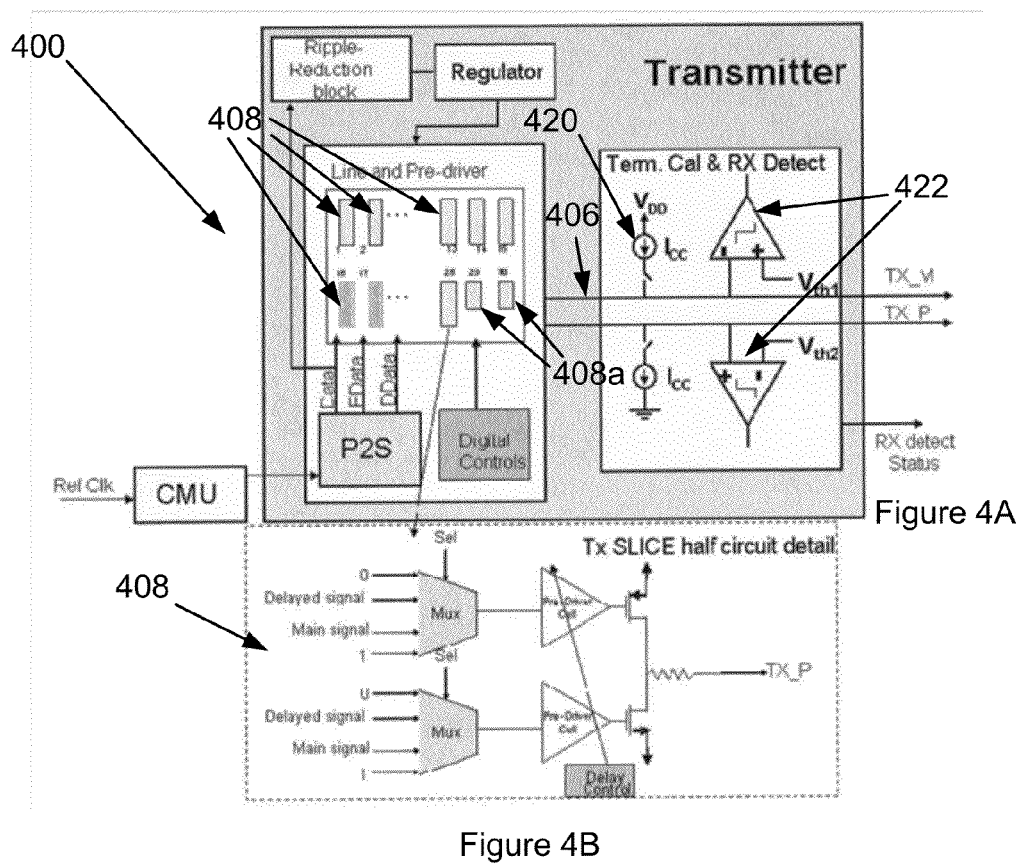
FIG. 4A is a simplified block diagram of a transmitter according to example embodiments.
FIG. 4B is a detailed view of a Tx slice half circuit from the transmitter of FIG. 4A.

FIG. 4A shows a block diagram of an example embodiment, while FIG. 4B shows a detailed half-circuit implementation of a single slice of the driver. As shown in FIG. 4A, the driver 400 is composed of N similar slices 408 connected in parallel. The example embodiment pictured in the figure selects N=30, although other numbers are equally possible.

Also, in the illustrated embodiment, two of these slices 408a are half the size of the remaining slices 408 to provide finer resolution for the transmit equalization.

Figure 10B:
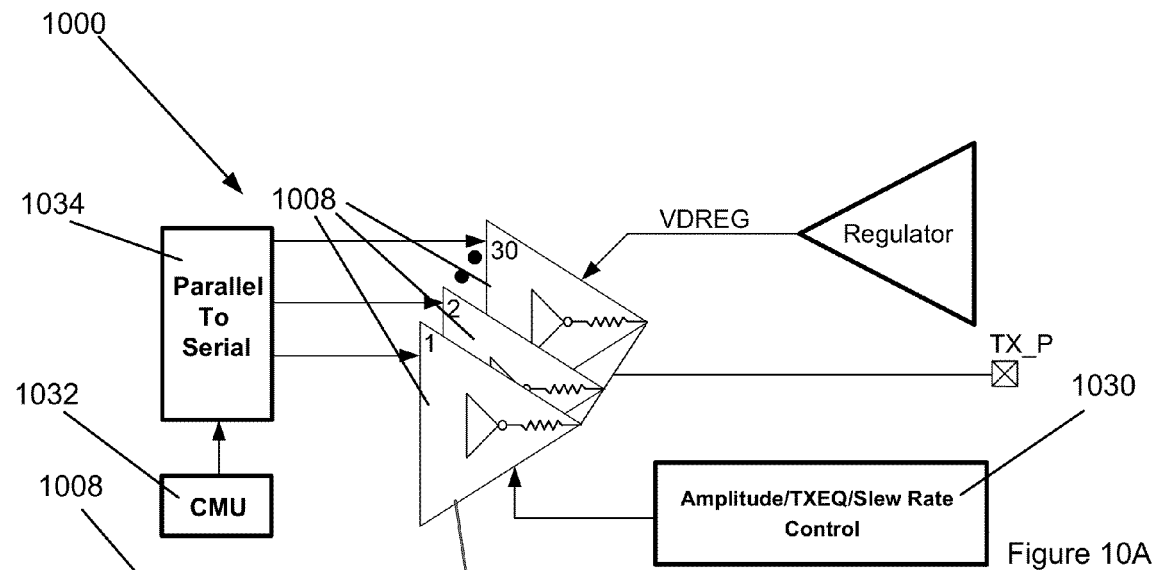
FIG. 10B is a detailed view of a Tx slice from the transmitter of FIG. 10A.
Figure 10B:
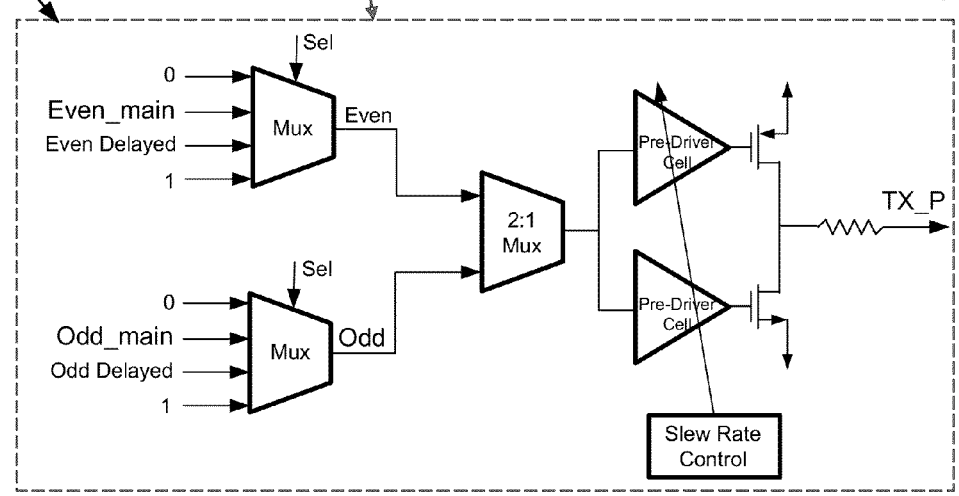

In a further example embodiment shown in FIG. 10A, a digital control block 1030 is used to control the amplitude, Transmit Equalization (TXEQ), and slew rate of the driver 1000. A Clock Multiplying Unit (CMU) 1032 is used for generating the high-speed clock for the driver 1000 and a parallel to serial block 1034 is used to serialize the input parallel data. FIG. 10B shows details of a single slice 1008 of the driver of FIG. 10A.

In example embodiments, an on-chip regulator is used to reduce the supply sensitivity of the driver. The use of an on-chip regulator can also provide for higher transmit amplitude. For example, the minimum low-voltage supply for advanced technology nodes (e.g. 28 nm) may in some embodiments be lower than 0.8V. Therefore, using the low-voltage supply for the driver may limit the swing to less than 800 mV, which could violate a number of optical and Ethernet standard specifications (See references [6]-[7]). Therefore, example embodiments use an on-chip regulator to provide larger output swings at lower supply voltages, and also provide improved jitter performance and reduced supply sensitivity.

Historically, the on-resistance of the switches in some SST drivers was designed to contribute less than 5% of the total termination resistance to simplify the termination calibration (See reference [3]). This, however, could increase the overall power of the driver and also force the pre-driver to be larger (See reference [3]). In the example embodiments described herein, both the NMOS and PMOS switches in the output stage are part of the termination network and designed to have an impedance typically 25% to 35% of the total termination resistance (typically 50Ω). This may allow the use of relatively small switches in the output stage that may translate into improved high-frequency performance and reduced pre-driver size. Since the on-resistance of these switches may vary over process technology variation, temperature, and supply, there may be a need to compensate for this variation with a technique for termination calibration in some embodiments.

Of the total number of driver slices 408, typically a subset of these slices can be used for output impedance termination calibration. For example, a specific embodiment with N=30 could use 12 slices for termination calibration, although other numbers are also possible. During calibration, these slices would be either connected to the input signal or tri-stated until the remaining slices in parallel provide 50Ω output impedance. As shown in FIG. 4A, termination calibration is performed in some embodiments by applying a DC current 420 to the driver output 406 and comparing the driver output 406 with a threshold through two comparators 422. This method calibrates the NMOS and PMOS independently and can therefore result in optimum termination for both pull-up and pull-down paths. The termination calibration technique presented here provides increased accuracy as it is not sensitive to mismatch. This is because the actual driver (and not a replica) is being used for calibration. It should be noted that the comparators 422 used for termination calibration can also be used for receiver detection, a feature sometimes required in wireline communication standards. And therefore the additional circuitry required for termination calibration is minimal (See reference [7]).

Figure 9:
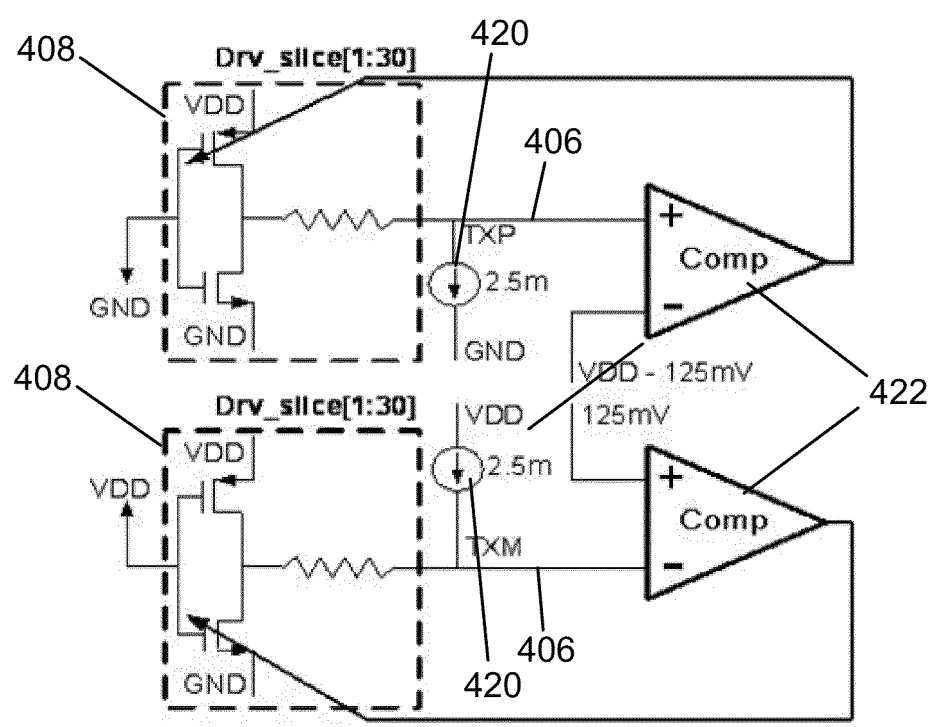
FIG. 9 is a detailed view of a termination calibration technique as applied to example embodiments.

FIG. 9 shows further details of the termination calibration according to an example embodiment. At the start of calibration the driver slices 408 are all on, which corresponds to a minimum termination resistor. Then, the DC current 420 is applied to the driver output 406, and for as long as the output of the comparators 422 is deemed to be above some threshold, the slices 408 are turned off one at a time. As soon as the comparator output toggles below the threshold, the calibration is stopped, therefore confirming that the inputs of the comparators would be very close to each other and therefore the termination should be very close to, e.g., 50 Ohms in the example embodiment.

Figure 5:
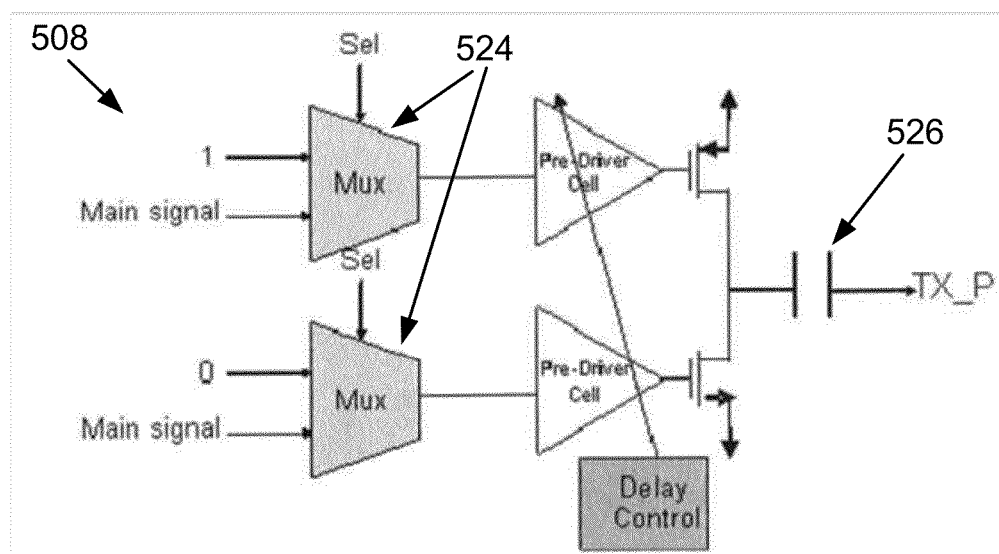
FIG. 5 is a simplified block diagram of a tx_slice_cap according to example embodiments.

The driver minimum rise/fall time may depend on the total capacitive load at the driver outputs 406. The main contributors to the capacitive load at the driver outputs in some embodiments are ESD diodes, pad capacitance, and both metalization and device parasitic capacitances of the driver output stage. In a typical embodiment of a practical SST driver, the capacitive load at the output is dominated by the pad capacitance and ESD diode capacitance. This cannot be reduced beyond a certain point without impacting manufacturability, ease of packaging, and reliability. However, for data rates higher than 14 Gb/s, faster slew rates may be needed to maintain the rise/fall times to a small fraction of the total data period (typically <20%). In the present described embodiments, this may be achieved by introducing another kind of slice in the driver. As shown in FIG. 5, this slice 508 replaces the series resistance at the inverter output with a series capacitor 526, and is identical to other slices in all other regards. Using the mutiplexer (MUX) blocks 524 in FIG. 5, these slices 508 can be turned off in applications that do not require very large slew rate. Pre-driver cells and delay control block are used for improving the matching between the regular driver slices 408 and this slice 508. Therefore, pre-driver cells and delay control block are added for improving the performance only and can be removed in some implementations. Using this technique, up to 40% smaller minimum rise/fall time can be achieved in some embodiments.

Figure 6A:
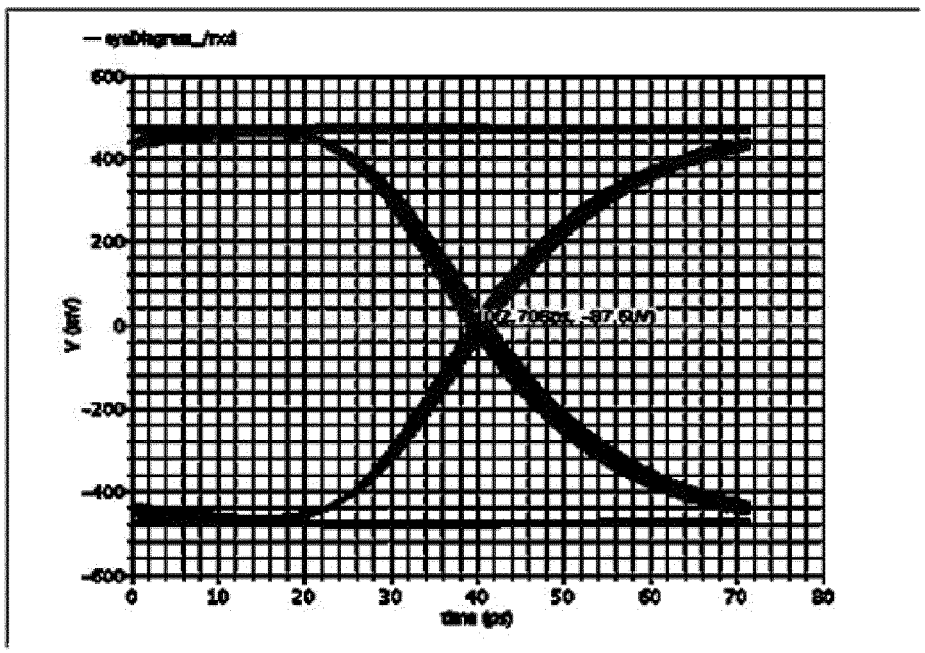
FIG. 6A is a simulated eye diagram at 14 Gb/s with ripple-reduction block on according to example embodiments.
Figure 6B:
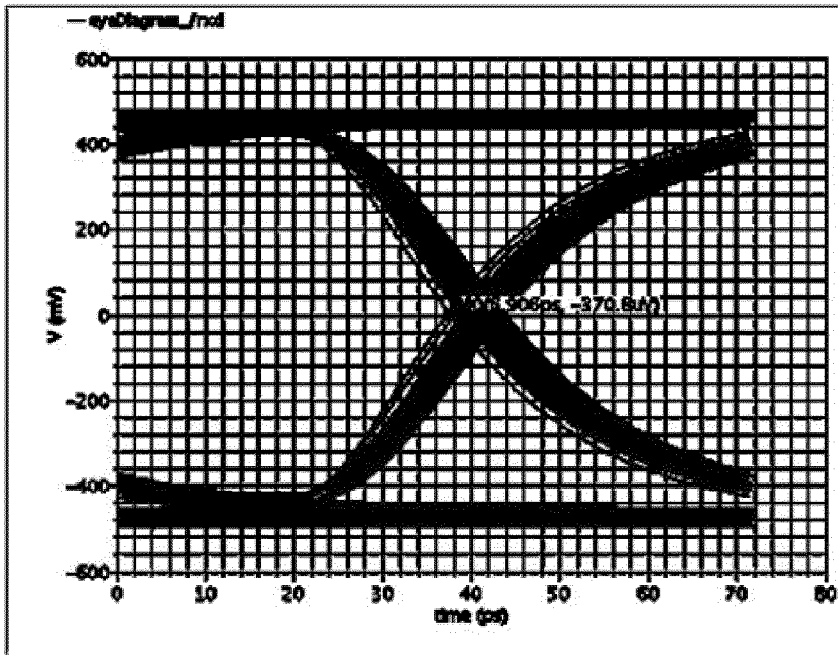
FIG. 6B is a simulated eye diagram at 14 Gb/s with ripple-reduction block off according to example embodiments.

Self-induced supply noise in SST drivers remains one of the main contributors to deterministic jitter in the transmitted data sequence. The issue is caused by the change of the transition density of the data sequence and becomes more pronounced when there is a long sequence of consecutive ones or zeros in the input data sequence. This can result in large ripple on the driver supply voltage, even for cases where the driver is supplied from an on-chip regulator. As an example, this ripple can be as large as 150 mV on a 800 mV supply. In the present described embodiments, a new ripple-reduction technique (RRT) is introduced to combat this data dependent deterministic jitter. This technique senses the transitions in the input data and draws a variable current from the supply that is inversely proportional to the input data transition density. This may result in a more constant current being drawn from the supply that is independent of the data pattern. This technique may be especially effective for combating supply variations that occur for long sequences of consecutive one or zeroes. Following the above example, this technique may be used in some embodiments to reduce the SST driver self-induced ripple from roughly 150 mV to 30 mV and therefore reduce the deterministic jitter at the driver output. For example, FIG. 6A shows a simulated eye diagram for an example implementation of the driver with the ripple-reduction block on, and FIG. 6B shows a simulated eye diagram for the same example implementation with the ripple-reduction block off. As shown in these figures, deterministic jitter of the driver may be reduced from 6.9 ps to 2.7 ps.

Figure 7:
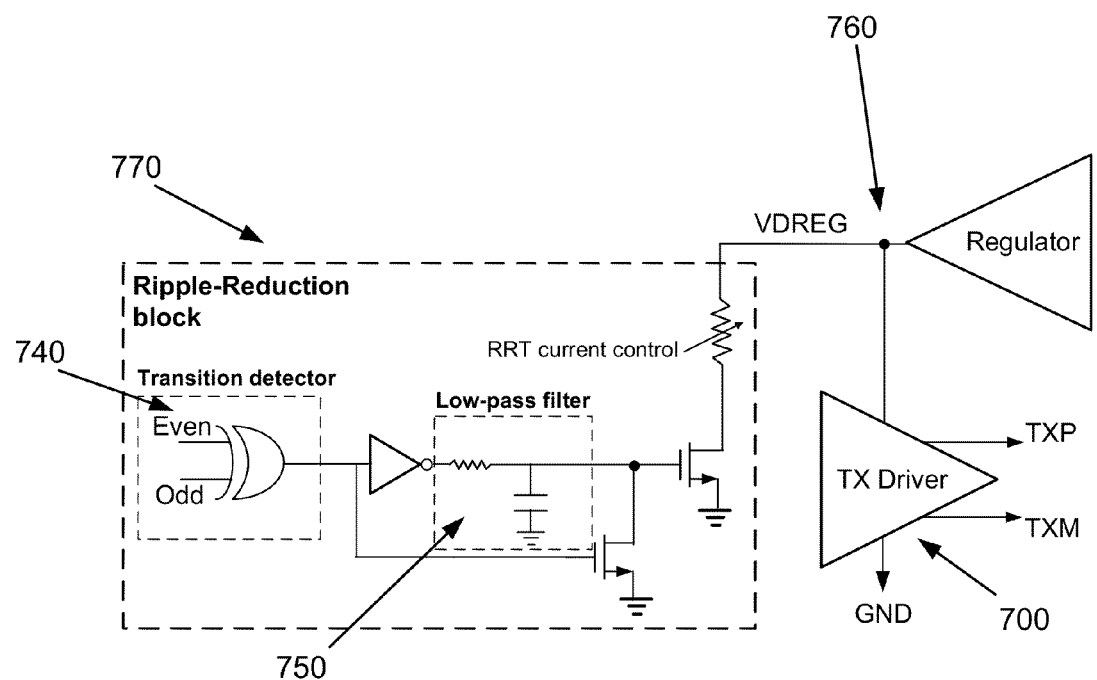
FIG. 7 shows an example implementation of a ripple-reduction technique as applied to example embodiments when a regulated supply is used for the transmit driver.
Figure 8:
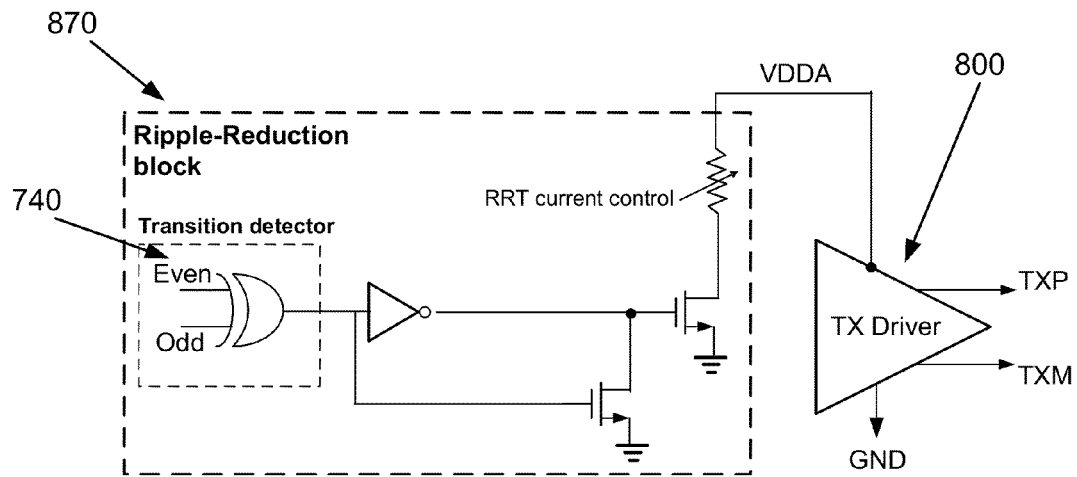
FIG. 8 shows an example implementation of a ripple-reduction technique as applied to example embodiments when a raw unregulated supply is used for the transmit driver.

FIG. 7 shows an example implementation of a ripple-reduction technique and ripple-reduction block 770 for a transmit driver 700 with a regulated supply 760. As shown in FIG. 7, a transition detector 740 could be as simple as one XOR gate, and a low-pass filter 750 can be used to not only minimize the jitter but also minimize the power overhead of this technique. As shown in FIG. 8, the ripple-reduction technique is also applicable when the driver 800 is using a unregulated supply. However, the low-pass filter 750 is generally removed from the ripple-reuduction block 870 in this example embodiment.

Although the ripple-reduction technique described above can be used for any type of driver, it is used for an SST driver topology in these example embodiments.

An additional technique employed to reduce jitter in the transmitted data in some embodiments is to perform the majority of any required signal processing at lower data rates (for example half-rate) and then multiplex (MUX) the data up to full-rate at the latest point possible in the data path. This is possible since the final MUX acts as a re-sampling stage where the jitter at the MUX output is determined largely by the quality of the clock (or select) input to the MUX and largely insensitive to the data input of the MUX. Example embodiments place the final two to one MUX within the SST driver itself and within the driver slice directly preceding the slew rate control block. Any accumulated jitter at the input of the final 2-to-1 MUX would be rejected by this block and the final driver jitter would not depend on the performance of the previous blocks. This technique may also improve the supply sensitivity of driver.

The design of transmit drivers is becoming more challenging as data rates increase and there is a need for new drivers that not only work at higher data rates but also meet stringent requirements for jitter and return loss. An example high-speed transmit driver architecture is presented based on an SST driver topology. Several techniques are used to improve the performance of the driver including: supply regulation to improve driver swing and reduce the supply sensitivity; a ripple-reduction technique to improve the jitter due to self-induced supply noise; a method to increase the maximum slew rate for data rates beyond 14 Gb/s; a new termination calibration method that is not sensitive to mismatch; and finally placing the final 2-to-1 MUX within the driver and close to the output stage to improve jitter and reduce supply sensitivity. In conclusion, the example architecture and techniques may be advantageous for the design of high-speed drivers, e.g. for data rates above 14 Gb/s.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

REFERENCES

The following documents are incorporated herein by reference:

[1] M. Ramezani, et al. "An 8.4 mw/Gb/s 4-lane 48 Gb/s Multi-Standard-compliant Transceiver in 40 nm digital CMOS Technology", ISSCC Dig. Tech. Papers, February 2011

[2] N. K. Ramamoorthy, R. M. Jayabharath, V. Muniyappa, "High Speed Serial Link Transmitter for 10Gig Ethernet Applications", VLSI Design, 2010. VLSID '10. 23rd International Conference on VLSI Design

[3] M. Kossel, et al. "A T-Coil-Enhanced 8.5 Gb/s High-Swing SST Transmitter in 65 nm Bulk CMOS With←−16 dB Return Loss Over 10 GHz Bandwidth", IEEE Journal of Solid-State Circuits, VOL. 43, No. 12, December 2008

[4] C. Menolfi, et al. "A 14 Gb/s high-swing Thin-Oxide Device SST TX in 45 nm CMOS SOI", ISSCC Dig. Tech. Papers, February 2011

[5] S. Quan, et al. "A 1.0625-to-14.025 Gb/s Multimedia Transceiver with Full-rate Source-Series-Terminated Transmit Driver and Floating-Tap Decision-Feedback Equalizer in 40 nm CMOS", ISSCC Dig. Tech. Papers, February 2011

[6] 10G BASE KR specification, IEEE 802.3ap v3.3 10 GBASE-KR Backplane

[7] "PCI Express Base specification", PCI_SIG, http://www.pcisig.com/specifications/pciexpress/base3/

What is claimed is:

1. A high-speed transmit driver comprising:
    at least one inverter with a series capacitor at the inverter output; and
    at least one mutiplex block to turn off the at least one inverter in applications that do not require a very large slew rate.

2. The high-speed transmit driver of claim 1, wherein applications that do not require a very large slew rate comprise applications with a data rate of less than 14 Gbp/s.

3. The high-speed transmit driver of claim 1, wherein a source series terminated driver architecture is used.

4. The high-speed transmit driver of claim 1, further comprising a controllable delay stage to maximize the driver slew rate.

5. A method of increasing the slew rate of a high-speed transmit driver comprising:
    receiving a driver input signal at the driver;
    feeding a portion of the driver input signal directly to a driver output through a feedforward path comprising a capacitive impedance network; and
    matching the delay of the feedforward path with the components of the driver that do not employ the feedforward path.

* * * * *